US010672577B2

United States Patent
Hurwitz et al.

(10) Patent No.: US 10,672,577 B2
(45) Date of Patent: Jun. 2, 2020

(54) SIGNAL CONDITIONING CIRCUIT AND A RELAY/CIRCUIT BREAKER CONTROL APPARATUS INCLUDING SUCH A SIGNAL CONDITIONING CIRCUIT

(71) Applicant: Analog Devices International Unlimited Company, Limerick (IE)

(72) Inventors: Jonathan Ephraim David Hurwitz, Edinburgh (GB); Seyed Amir Ali Danesh, Edinburgh (GB); Iain Barnett, Lasswade (GB)

(73) Assignee: Analog Devices International Unlimited Company, Limerick (IE)

( * ) Notice: Subject to any disclaimer, the term of this patent is extended or adjusted under 35 U.S.C. 154(b) by 90 days.

(21) Appl. No.: 15/424,487

(22) Filed: Feb. 3, 2017

(65) Prior Publication Data

US 2017/0250043 A1    Aug. 31, 2017

(30) Foreign Application Priority Data

Feb. 26, 2016  (GB) .................................. 1603385.4

(51) Int. Cl.
*H01H 47/02*    (2006.01)
*H01H 47/00*    (2006.01)
(Continued)

(52) U.S. Cl.
CPC ......... *H01H 47/02* (2013.01); *G01R 31/3278* (2013.01); *H01H 47/002* (2013.01);
(Continued)

(58) Field of Classification Search
CPC ... H01H 47/02; H01H 47/002; G01R 31/3278
See application file for complete search history.

(56) References Cited

U.S. PATENT DOCUMENTS

| 5,499,155 A | 3/1996 | Gershen et al. | |
|---|---|---|---|
| 6,871,225 B1 * | 3/2005 | Brennan | ................. H04L 29/06 700/286 |

(Continued)

FOREIGN PATENT DOCUMENTS

| CN | 1233892 | 11/1999 |
|---|---|---|
| CN | 101754411 | 6/2010 |

(Continued)

OTHER PUBLICATIONS

"U.S. Appl. No. 17/156,272 EP Search Report dated Feb. 8, 2017", 15 pgs.

(Continued)

*Primary Examiner* — Scott Bauer
(74) *Attorney, Agent, or Firm* — Schwegman Lundberg & Woessner, P.A.

(57) ABSTRACT

There is a need to monitor and control the state of relays and circuit breakers within power distribution systems. The monitoring of a relay state, i.e. open or closed, is often performed by applying a monitoring signal to sensing contacts added to the relay. Manufactures of such systems have chosen many different voltages for their own monitoring systems making it difficult to interconnect dissimilar monitoring systems. A signal conditioning circuit is provided that can cope with a large input voltage range and can be configured to allow may items of equipment (which may be new item or legacy items) to be connected to a controller.

29 Claims, 8 Drawing Sheets

(51) Int. Cl.
*H01H 71/12* (2006.01)
*G01R 31/327* (2006.01)
*H02H 3/04* (2006.01)
*H03H 21/00* (2006.01)
*H01H 83/20* (2006.01)

(52) U.S. Cl.
CPC ............ *H01H 71/125* (2013.01); *H02H 3/04* (2013.01); *H03H 21/0012* (2013.01); *H01H 2083/201* (2013.01)

(56) References Cited

U.S. PATENT DOCUMENTS

| | | | |
|---|---|---|---|
| 2006/0185429 A1 | 8/2006 | Liu et al. | |
| 2008/0273527 A1* | 11/2008 | Short | H04J 3/0655 370/364 |
| 2012/0022814 A1* | 1/2012 | Swarztrauber | G01D 4/002 702/62 |
| 2013/0123998 A1* | 5/2013 | King | G06F 1/30 700/292 |
| 2014/0055151 A1 | 2/2014 | Nguyen | |
| 2014/0320195 A1* | 10/2014 | Desai | H01H 47/002 327/382 |
| 2015/0236509 A1* | 8/2015 | Divan | H02J 3/16 700/298 |
| 2016/0091950 A1* | 3/2016 | Thompson | G06F 1/3206 713/320 |

FOREIGN PATENT DOCUMENTS

| | | |
|---|---|---|
| EP | 0559580 A1 | 9/1993 |
| EP | 1763137 A2 | 3/2007 |
| WO | WO-9943065 A1 | 8/1999 |
| WO | 2013137971 | 9/2013 |

OTHER PUBLICATIONS

"Digital Isolator, Enhanced System-Level ESD Reliability", Analog Devices—ADuM3100, (2015), 17 pgs.

"Chinese Application U.S. Appl. No. 201710110228.X, Office Action dated Aug. 1, 2018", w/ English translation, 21 pgs.

"Chinese Application Serial No. 201710110228.X, Office Action dated Nov. 1, 2019", W/ English Translation, 18 pgs.

"European Application Serial No. 17156272.1, Communication pursuant to Article 94(3) EPC dated Jan. 15, 2020", 6 pgs.

\* cited by examiner

SIGNAL CONDITIONING CIRCUIT AND A RELAY/CIRCUIT BREAKER CONTROL APPARATUS INCLUDING SUCH A SIGNAL CONDITIONING CIRCUIT

CLAIM OF PRIORITY

This application claims priority to U.K. Patent Application Serial No. 1603385.4, filed Feb. 26, 2016, which is incorporated herein by reference in its entirety.

FIELD

The present disclosure relates to a signal conditioning circuit suitable for use in relay control systems, as typically found in power distribution systems.

BACKGROUND

It is known to provide electromechanical switches, for example in the form of relays and circuit breakers within electricity distribution systems. The purpose of relays is to control the flow of energy from one place to another, whereas the primary purpose of a circuit breaker is more protective, in that it seeks to prevent damage from occurring in over voltage or over current conditions by becoming open circuit.

In order to reliably detect the status of a relay or a circuit breaker, such relays or circuit breakers often have additional sensing contacts formed on the armature which moves to open or close the primary current flow path associated with the armature. Thus the sensing contacts enable a sensing signal to be applied to the relay to confirm whether the relay is open or closed. This stops unexpected fault modes, which may result from failure of a relay coil or sensing circuitry associated with a relay or circuit breaker from remaining hidden to the power distribution system or to a control system associated with the power distribution system.

Manufacturers and installers of relay and circuit breaker monitoring equipment have applied monitoring signals to the sensing contacts. However, the magnitude of the signals chosen has not benefitted from the provision of international standards and varies by manufacturer, application and country. Thus some manufacturers and installers have chosen to use relatively low sensing voltages, for example in the 5 to 10 volt range, whereas other manufacturers and installers have used sensing voltages at the prevailing mains distribution voltage, and therefore such voltages may be in the 115 volt range, 230-240 volt range or even higher. This inhibits the provision of equipment which is interoperable with the various relay control and monitoring systems installed around the world.

SUMMARY

According to a first aspect of this disclosure there is provided a signal conditioning circuit, the signal conditioning circuit comprising at least one input node connected to an input stage for processing an input signal received at the at least one input node and an adjustable load to apply a load at the at least one input node.

Preferably the input stage is programmable.

By providing a programmable input stage, it becomes possible to programmatically control an amount of attenuation provided to an input signal in order that various magnitudes of input signal may be converted to a similar signal voltage range for subsequent processing.

Alternatively the input signal could be attenuated by a set value that suits any expected input voltage. It may then be subjected to gain and/or scaling in the analog or digital domain.

Within the context of a relay or circuit breaker control system, which may handle high voltages and large currents, there is potential for the electrical environment to be electrically noisy. The provision of an adjustable load connected to the input node and thereby to the relay or circuit breaker sensing contacts associated with that node gives the signal conditioning circuit some robustness against electrical noise.

Advantageously the adjustable load is controllable to vary its impedance, or at least the current drawn by the load, to provide robustness in the presence of noise whilst not needlessly consuming current. Preferably the current drawn by the adjustable load changes dynamically in response to the magnitude of the voltage at the programmable input stage and/or to the rate of change with respect of time of the voltage at the input node connected to the programmable input stage.

Advantageously the programmable input stage further comprises a programmable thresholding circuit or comparator and/or a programmable attenuator such that the noisy input signals can be converted into a well-defined binary signal for use by relay control logic.

Advantageously the adjustable load is responsive to relay or circuit breaker control signals to open or close the relay in order that the load can provide a wetting current in order to break any surface film that is formed on the contacts of the relay which might otherwise form and break the electrical circuit.

According to a second aspect of the present disclosure there is provided a relay controller responsive to at least one input signal in order to change the state of a relay or circuit breaker, wherein the relay controller has at least one of:
a) a programmable input signal scaler;
b) a programmable wetting current controller;
c) a programmable input signal filter.

According to a third aspect of the present disclosure there is provided a relay and/or circuit breaker controller including a signal conditioning circuit in accordance with a first aspect of this disclosure.

There is further provided a method of interconnecting a plurality of circuit breakers and/or relays, the method comprising interfacing the circuit breakers and/or relays with a controller by way of a signal conditioning circuit to provide attenuation to an input and to pass a controllable current through the input.

BRIEF DESCRIPTION OF THE DRAWINGS

Embodiments of the present disclosure will be described, by way of non-limiting example only, with reference to the accompanying Figures, in which.

DESCRIPTION OF SOME EMBODIMENTS OF THE DISCLOSURE

Figure 1:
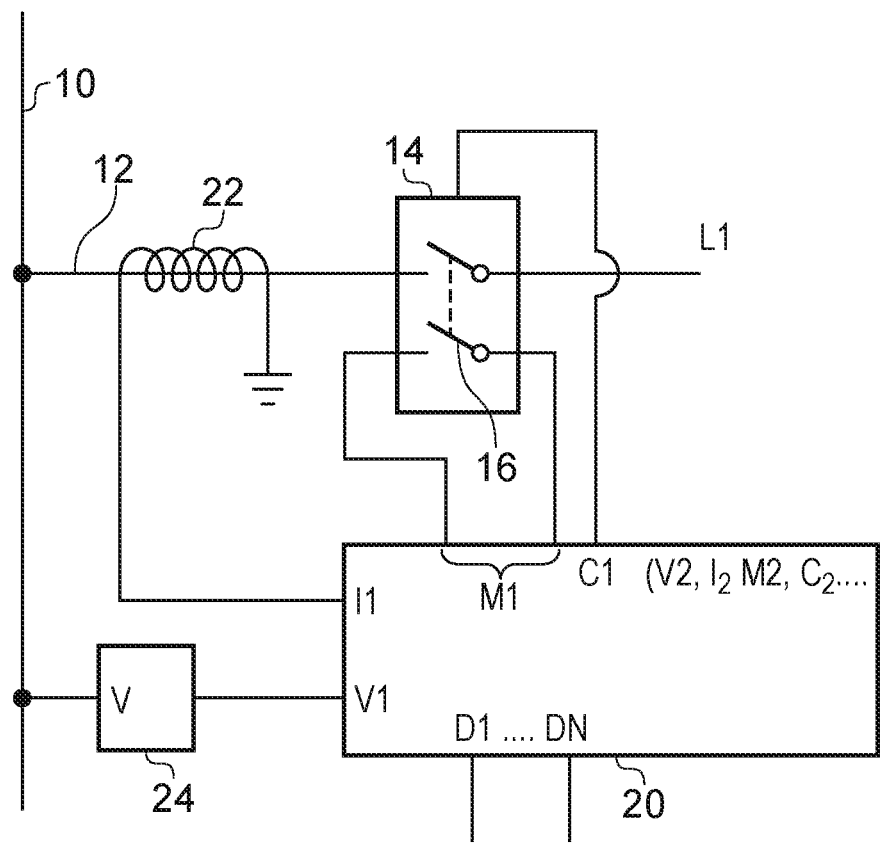
FIG. 1 schematically illustrates a circuit breaker and its controller within part of a power distribution system.

FIG. 1 schematically illustrates a part of a power distribution system. A first power line 10 may be connected to a power distribution network, for example to a generator facility or to distribution nodes within an industrial or residential area. The power line 10 may provide electrical power to a plurality of users (be that individuals, houses, factories, offices, or items of plant or machinery) by way of various distribution spurs of which one, designated 12, is indicated in FIG. 1. The power distribution company is under an obligation to provide electrical power to all of its users and hence it does not want the activities of one user, be those malicious or inadvertent, to cause failure of the power distribution network. For this reason the electrical power passes through protective devices, in the form of relays or, as shown here, a circuit breaker 14 which can serve to interrupt the flow of current through distribution line 12 in the event that the current therein becomes too large. The provision of relays and circuit breakers allows reconfiguration of the power distribution system.

In the past such circuit breakers 14 used to be able to act autonomously to interrupt current flow when it was excessive without knowledge of or consideration of the impact of such an action. This can be detrimental to the power distribution system as a whole and can contribute to cascading power failures, and as a result of that the industry has moved towards management and control systems where the status of a plurality of relays or contact breakers are monitored and controlled by a local relay controller, which may be one control node in a distributed control system or may be responsive to a centralized control node within the local area. The local relay controller is indicated as item 20 in FIG. 1.

For the purposes of the following discussion the term "relay" or circuit breaker should be regarded as referring to an electrically controllable switch. The switch may be mechanical or solid state.

The term relay controller refers to a device which provides a control signal to the relay to control whether it is conducting between first and second nodes or not conducting between first and second nodes.

The relay controller 20 can control the status of relays and circuit breakers for a plurality of load lines L1, L2 and so on of which line 12 represents a first line L1. In order to monitor the status of the distribution system the relay controller 20 is responsive to a current measurement device which indicates the current flow in line L1 and provides an indication of that current to input I1 of the relay controller 20. The measurement device can conveniently be a current transformer 22. Similarly, the relay controller 20 may be responsive to a measurement circuit 24 which measures the voltage V of line L1 or on distribution line 10 and provides this to input V1. These two inputs give the controller 20 direct knowledge of the current and voltage pertaining at that time on the distribution line L1 (12). The controller 20 is operable to provide a control signal C1 to control the status of the circuit breaker 14. Thus when C1 is energized an armature within the circuit breaker 14 may be moved to interrupt current flow along line L1. Because component failure may make it difficult to determine the state of the circuit breaker, for example the connection to the current transformer 22 may fail, the controller may monitor a sensing voltage or a sensing current flow through some sensing or measurement contacts 16 provided within the circuit breaker 14, where the status of the sensing or measurement contacts is indicative of the status of the main current flow path through the circuit breaker 14. The sensing/measurement contacts 16 can be assessed by one or two terminals, designated M1, which confirm that the status of the circuit breaker 14 associated with line L1. Similar components, namely circuit breakers or relays, current transformers and if desired volt meters, can be associated with further lines L2, L3, L4 and so on, none of which have been shown, each controlled by the controller 20.

The controller 20 may have one or more further inputs by which it can receive data relating to the status of other relays or other system parameters such as line current, line voltage or line frequency, which are either directly connected to it or where that data is transferred to the controller 20 by way of other controllers within a distributed control network. These other inputs are designated D1 to DN. Being able to exchange data with other controllers is beneficial in enabling a controller to decide how to respond to an event within the power supply system. For example if line L1 were to become short circuited then the current in line 12/L1 would rise and the voltage on line 10 would drop, giving a good indication of a short circuit event. However a rise in current could arise from a large (and legitimate) load being connected to L1. If, however, the loading on the distribution as a whole was also large and the generating capacity had not, as yet, managed to respond to the load then the voltage on line 10 may fall from its nominal voltage. Under these circumstances a controller acting in isolation might conclude that a short circuit condition exists and act to operate the circuit breaker 14 even though the line 12/L1 was not shorted. However if the controller 20 could receive information from other controllers and be aware of the large currents and lower voltages prevailing in other sections of the distribution network it would be better able to correctly decide not to operate the circuit breaker 14. This is advantageous, both in terms of avoiding unnecessary interruption of supply to a consumer and also avoiding prompting the network to enter a potentially unstable or hazarded state where cascade disconnections may occur.

Various manufacturers may install circuit breakers within a single installation (or area, factory or distribution station). Each manufacturer may have specified a respective voltage to be supplied to the sensing contacts within their respective circuit breaker or relay. Indeed, that voltage may be supplied by a different (further) component, such as one provided in close association with the respective relay or circuit breaker such that the connection to the controller 20 is only by way of a single line and controller has no influence over the sensing voltage that is provided to it. The use of differing sensing voltages by different equipment manufactures has hindered users from adopting equipment from differing suppliers, thereby allowing equipment suppliers to lock customers in. To allow interoperability between competing systems the controller may need to cope with a wide range of sensing voltages. Additionally, when faced with the chance to supply equipment to an existing installation, a manufacturer may be compelled to install equipment operating at the site sensing voltage. This may require the manufacturer to change the attenuation level within their equipment, with the need to provide adjustable or controllable attenuators on a circuit board. This gives an increased cost to the manufacturer, and an increased risk that board may be installed incorrectly. All of these costs are eventually borne by the customer.

Figure 2:
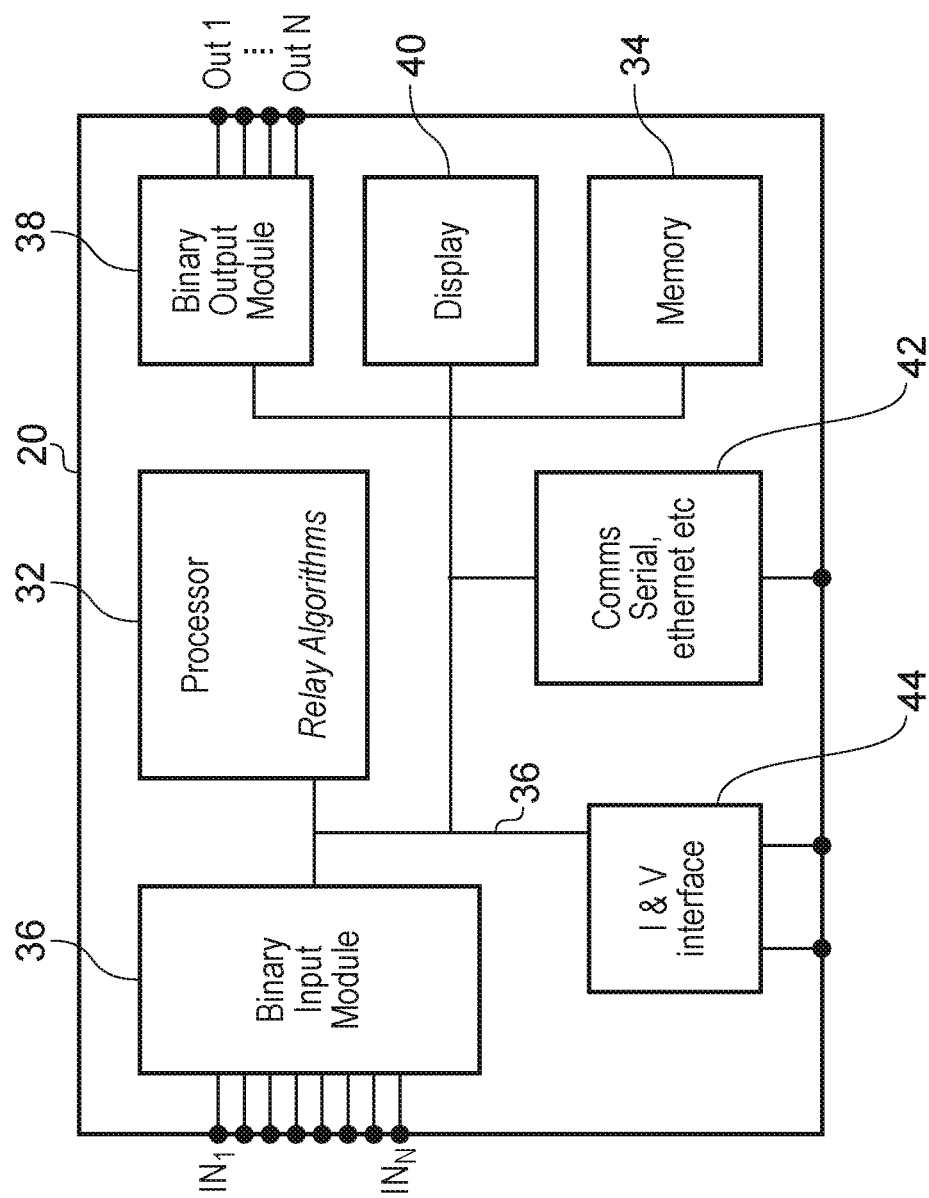
FIG. 2 schematically illustrates the components that may be provided within a controller for a plurality of relays or circuit breakers within a distribution system.

FIG. 2 schematically illustrates the components provided within an embodiment of a controller 20 shown in FIG. 1 and constituting an embodiment of the present disclosure. The controller 20 may include several sub-systems. In the arrangement shown in FIG. 2 the controller comprises a data processor 32 in association with a memory 34 such that the processor 32 can execute various relay control algorithms. The data processor is responsive to input signals by way of a binary input module 36 and can control the relays that it is responsible for by way of a binary output module 38 having outputs OUT1 to OUTN for driving relay coils or circuit breaker coils. The data processor may further be associated with a display and/or other user interface 40 and a machine to machine communication interface 42. The controller 20 may further include an analogue interface 44 for receiving the outputs of the current transformers and/or voltage sensing circuits.

The binary input module 36 performs a signal conditioning function, in that it may receive a variety of notionally binary (switched) signals which may be in any one of a plurality of input voltage ranges. Thus, some of the sensing contacts may be connected to a relatively low voltage supply, such as a 10 volt supply, and may provide a digital signal that spans between zero and 10 volts. However other ones of the sensing contacts may be connected to a rectified version of the line voltage on the power line 10, and hence the input voltage may be in the range of several hundred volts, and possibly around 300 to 320 volts. These voltage ranges are only provided as examples.

Figure 3:
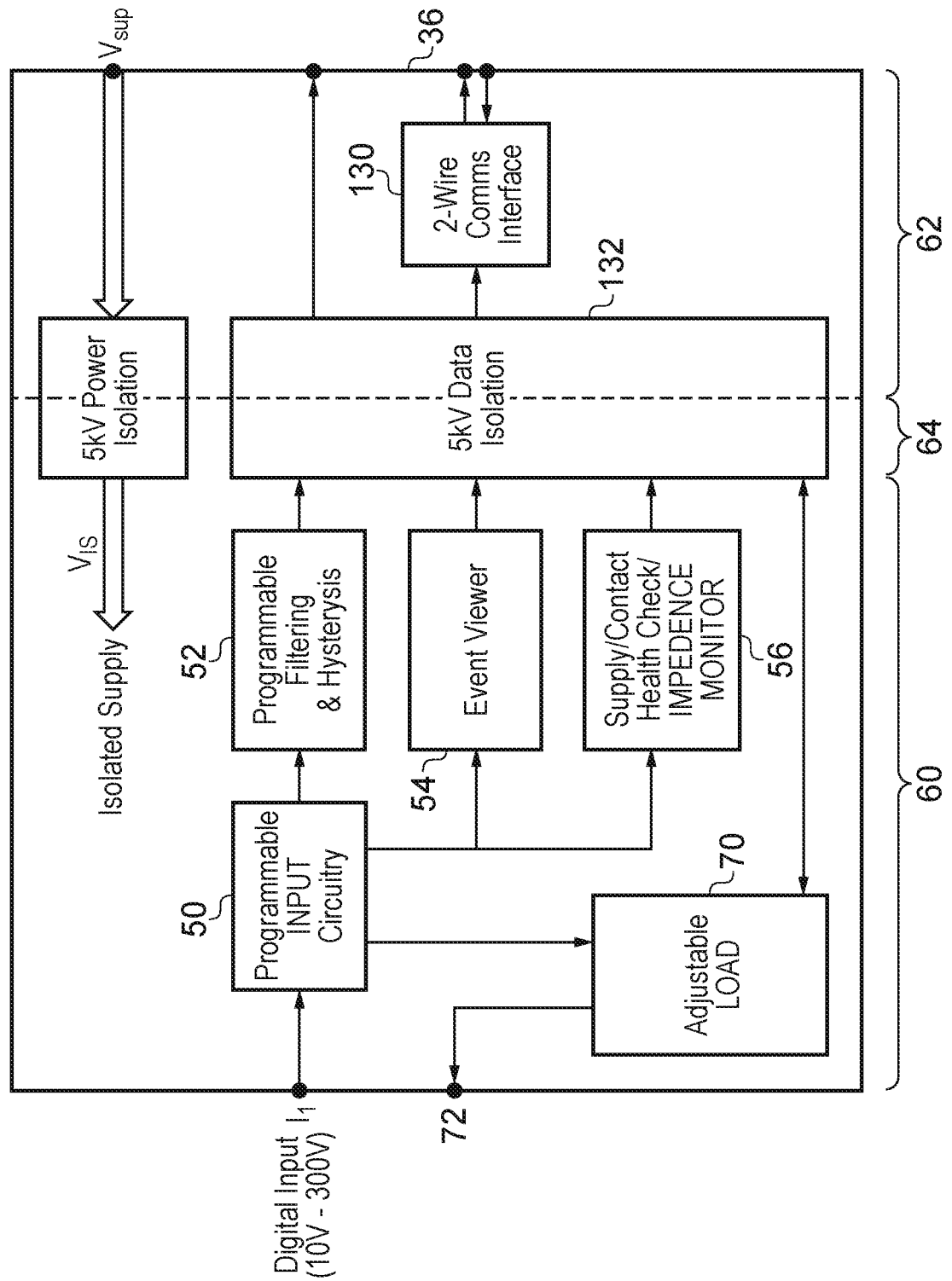
FIG. 3 schematically illustrates the circuit components within a signal conditioning circuit constituting an embodiment of the present disclosure.

In order to provide a versatile binary input module which is widely applicable within a number of different relay and circuit breaker control environments, the binary input module 36 advantageously comprises a programmable input circuit designated 50 in FIG. 3 which comprises a programmable attenuator, for example in the form of a resistor string and associated switches, which enables the input range to be transformed from the potentially large input range to a more tightly controlled one. The programmable resistor string may be associated with protection circuits, such as clamping diodes, in order to ensure that mis-programming of the attenuator range does not damage the components within the binary input module 36. Resistor string attenuators are not the only input circuit that might be provided, and as an example other input circuits might simply comprise clamping components to clamp the input signals to a prescribed range or the input circuits might monitor the current flow rather than the voltage through the sensing contacts and might include current to voltage converters, for example by measuring the voltage drop across a resistor in the current flow path, in order to transform the input signals into a predefined voltage domain for subsequent processing by other circuits within the binary input module. The input circuit may also include programmable level shifters and threshold generators for generating comparison thresholds for comparators used to clean the input signals into a more reliable digitized form. As a further alternative the programmable input circuit may include one or more analog to digital convertors which serve to digitize the various input signals and to provide digital words to further sub-systems within the binary input module 36. The use of analog to digital convertors allows more information to be gathered concerning the evolution of currents or voltages at or around a circuit trip event which may facilitate diagnostic activities of the distribution system operator at a later date. In a further option the attenuators may be fixed to cope with the largest input voltage that the manufacturer would expect to see across all installations. The attenuated signal may then be subjected to variable gain and/or variable thresholding.

The programmable input circuit 50 is responsive to a plurality of input nodes in the range 1 to N of which only one input node $I_1$ has been shown in FIG. 3 for diagrammatic simplicity.

An output of the programmable input circuitry 50 can be sent to various sub-systems within the binary input module 36. Thus a first output can be provided to a programmable filter and hysteresis unit 52 which can be used to provide a low pass or a delaying function to the signals received from the programmable input circuitry 50 in order to implement a switch de-bounce function. Signals from the input circuitry can also be logged in an event viewer which may keep a snapshot of the status of the signals on the inputs IN1 to INn within a period of time determined by the size of the memory allocated to the event viewer 54. An output of the input circuitry 50 may also be supplied to a health check module 56 whose function is to monitor the power supply to the sensing contacts and/or to infer the physical and electrical goodness of the contacts from the electrical response of the contacts both in a switched state and during the switching event. Thus in an embodiment the health check module 56 may monitor the impedance of the monitoring contacts. It may also check the voltage supplied to the monitoring contacts such that wiring faults cannot remain hidden. Additionally the health check circuitry may also be arranged to monitor other things such as the integrity of the supply to the input circuit, the electrical noise that the circuit is exposed to or parameters of the substation supply, such as mains line voltage, frequency, harmonic content and so on, or these tasks may be performed by one or more functional blocks within the relay controller.

The input circuitry 50, filter 52 event viewer 54 and health check system 56 have the potential to be exposed to high voltages, either during normal operation or in the event of a perturbation of the power supply, for example as a result of a lightning strike to a distribution line. It is therefore desirable to protect components of the controller 20 from exposure to such high voltages which might damage those components, such as the data processor 32.

The binary input module 36 can be configured to address the problem of overvoltage damage occurring within the controller 20 by separating the components of the binary input module into components within a first domain 60 which connects to the at least one input node, components within a second domain 62 which are in direct (galvanic) connection with other components within the controller 20, and an isolation domain 64 between the first domain 60 and the second domain 62.

The circuits in the first domain 60 require electrical power to operate. This could be derived from the lines that are being monitored (for example by way of the current transformer). However a preferred approach is to use power from a known voltage supply $V_{sup}$ in a low power (second) domain, which is transformed across a power isolator, such as a magnetic transformer, to form an isolated power supply $V_{IS}$ which is provided to the input circuit 50, the filter 52, the event viewer 54 and the health checking component 56. In this embodiment the binary input module 36 also includes a controllable load 70 which may be responsive to signals transferred to it from other components within the controller 20 and/or may act autonomously in response to the voltage received at one of the input nodes to which it has been associated, either programmatically or by the use of physical switches or jumpers. In other variations the controllable load may be provided outside of the binary input circuit.

Mechanical relays and circuit breakers show a couple of undesirable characteristics. One of these is that the metal contacts act like springs during switching and when closing a relay the contacts initially touch then bounce apart then touch again and then bounce apart and so on before finally closing properly. This rapid series of switching events can look very much like external noise and can also be the source of electrical noise. Therefore rapid switching signals might be real because they are related to contact bounce or they might be spurious because they stem from electrical noise. It is desirable to be able to clean up the input signals resulting from both of these actions and to differentiate between them.

We will firstly consider the case of contact bounce, i.e. a real signal, but where the switching transient is dirty because of the bouncing contacts and the parasitic capacitance and inductance associated with the various connections to the monitoring contacts within the relay or circuit breaker.

Figure 4:
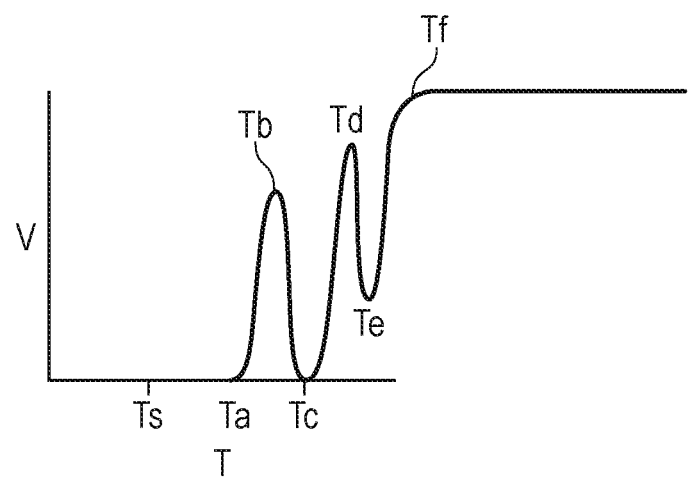
FIG. 4 schematically illustrates the effect of contact bounce during operation of a relay or contact breaker.

FIG. 4 schematically illustrates the evolution of voltage with respect to time at the monitoring node of the binary input module associated with the sensing contacts of relay in response to a switching event occurring at time Ts causing the contacts to close. Initially there is a delay whilst the contacts are moved from their open position to their closed position. At time $T_a$ the contacts touch and the voltage starts to rise. However a little while later the contacts bounce apart again at time $T_b$ and the voltage starts to fall. Then some time later, at time $T_c$, the contacts touch again and the voltage starts to rise. This time the magnitude of the bounce is smaller and hence the voltage rises much further towards its final point until at time $T_d$ the contacts separate and the voltage starts to fall, until time $T_e$ when the contacts make for the final time and the voltage rises towards its final steady state value, this value being obtained around time $T_f$.

Combinational logic systems would be sufficiently fast in order to be affected by the spurious making and breaking of contact, and hence it is desirable to filter the signal in the filtering and hysteresis unit 52 in order to clean the signal up so that an output signal only transitions one time from the zero value to the asserted value (or vice versa, as appropriate) thereby confirming the operation of the relay. The programmable filtering provided by the unit 52, which may for example by implemented by a finite impulse response low pass filter introduces some delay in confirming that the contact breaker or relay has operated, and hence the filter characteristics need to be chosen with some degree of care in order to achieve the right compromise between responsiveness and excess delay.

When the sensing contact 16 (FIG. 1) is open, the associated input node of the programmable input circuitry 50 may be allowed to float. It therefore becomes responsive to spurious signals which may look like the relay has closed. It is therefore desirable to provide some loading at the input path to pull the signals to ground or some other defined value. In an electrically noisy environment as might occur when switching hundreds of amps at mains voltage or at distribution voltages then electrical noise may be significant. Under such circumstances it would be desirable for the loading at the binary input module inputs to be quite low impedance in order to be robust against the influence of interference. However a downside with this approach is sinking a significant amount of current generates heat, especially when the binary input module is implemented in a small space such as that of an integrated circuit or a module on a circuit board. Therefore it is desirable to use an adjustable or intelligent load 70 which can be controlled to vary the amount of current that it sinks in response to the voltage at the input node.

Figure 5A:
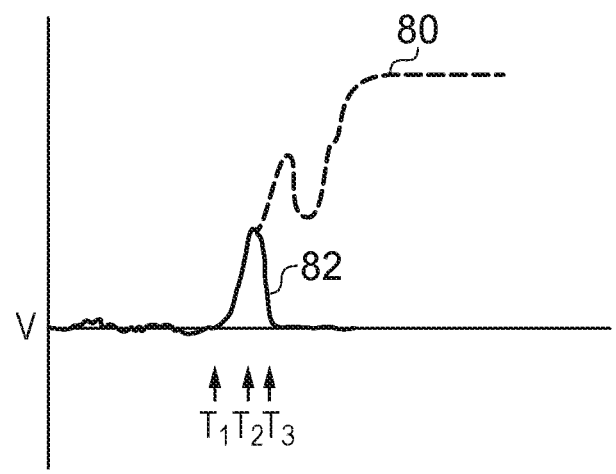
FIG. 5*a* diagrammatically indicates how the voltage at the input node may evolve depending on whether the signal applied thereto is real or spurious, and FIG. 5*b* schematically illustrates the demand current demanding by the intelligent load in response to a change of voltage at the input node.
Figure 5B:
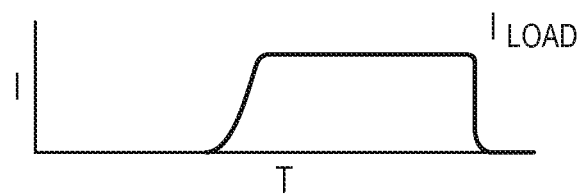

FIG. 5A shows the voltage V at the input node IN1 and its evolution with respect to time. At time T1 the voltage starts to rise. However at this point in time it is unclear whether the rise is a result of a real switching event or is a result of spurious signal. However the binary input module can determine which one of these conditions is occurring as a result of controlling the current sunk by the adjustable load 70. As noted before, it is undesirable to pass large amounts of current all the time, and hence as shown in FIG. 5B the adjustable load largely passes little or potentially no current. However the adjustable load is responsive to the programmable input circuitry to monitor the rate of change of the voltage at the input node. The voltage rises at a relatively steep rate between periods $T_1$ and $T_2$, and this continuing rate of change is sufficient to indicate to processing circuitry within the input circuit, within the adjustable load 70 or to the data processor that a switching event may be occurring and that the system needs to be able to determine whether the switching event is actually happening or whether the signal is spurious. In order to do this, the adjustable load starts to increase the current (autonomously or under instruction from the data processor or a suitable control circuit) that it sinks from time $T_2$ where the current rises from a minimal value to a load value. If the relay is switching states, and hence the change in voltage is real, then the current flow path through the monitoring relay contacts, whether they bounce or not, will be sufficient to provide current flow in excess of that maximum current I load drawn from the adjustable load 70, and hence the voltage will continue to rise as indicated by the path of the chain line 80 in FIG. 5A. However, if the voltage change observed in FIG. 5A results from electrically induced noise, then once the adjustable load starts to draw current the voltage will collapse towards zero as indicated by the chain-dot line 82 in FIG. 5A. Thus operation of the load can be used to determine whether a switching event is real or spurious without having to continuously and needlessly drawn current. The load current can be returned to its notional low value a short time after the potential switching event was detected.

Another feature of relays and contacts is their need to have a wetting current. In the absence of a wetting current the electrodes tend to oxidize and hence when the relay is operated the oxide may prevent an electrical circuit being made. If a wetting current is provided then this can prevent oxidation from occurring, and also the switching spark can break through any oxidation that has occurred. However, continuously providing a wetting current is wasteful of energy and is not necessary. It is advantageous to be able to periodically provide a wetting current in order to ensure correct operation of the relay without having to sink/supply current needlessly hour after hour. Thus, once again, the adjustable load 70 can be caused to pass a current, the load 70 acting either autonomously or in response to a wetting current control signal which has been passed to it from the data processor across a communications bus 36 that links the various components within the controller 20.

Figure 6:
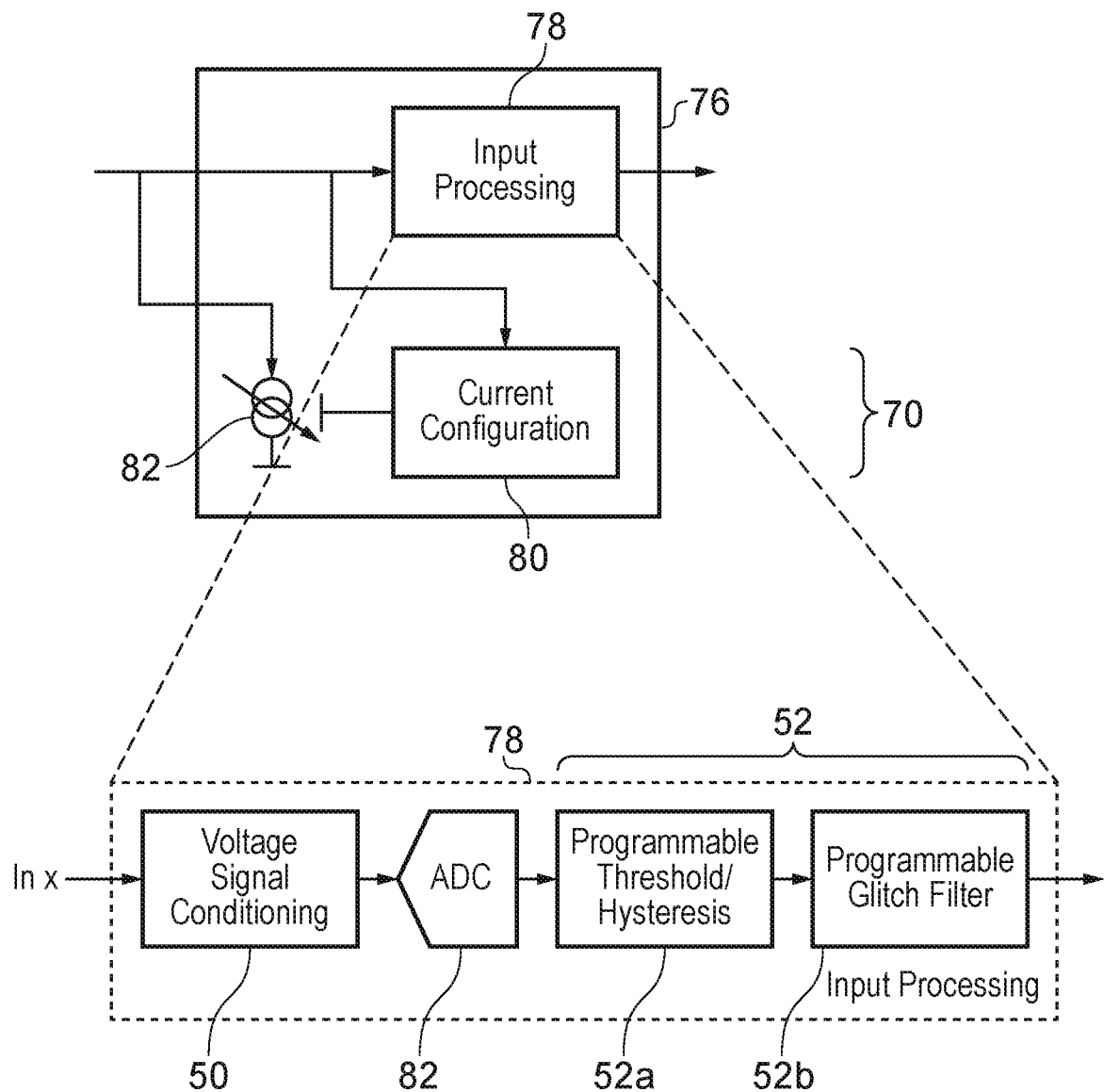
FIG. 6 schematically represents a single channel of an embodiment of an input stage in accordance with the present disclosure.

FIG. 6 schematically illustrates an interface 76 comprising an input processing sub-system 78 and an adjustable load 70. The adjustable load comprises a current configuration section 80 and a current source/current sink 82.

The input processing sub-system 78 in this example comprises a signal conditioning section which may provide programmable gain/attenuation to input signals to bring them into a harmonized voltage range. The signal conditioning section may be the programmable input circuit 50 described with respect to FIG. 3. The conditioned signal from one or more input nodes Inx is, in this example, then digitized by an analog to digital converter 82. The analog to digital converter may be of any suitable implementing technology, with successive approximation or sigma-delta converters being likely choices. The digital output representing the input signal is provided to a programmable threshold and hysteresis unit 52a and then to a programmable glitch filter 52b, both of which may be provided in block 52 of FIG. 3, so as to yield a cleaned signal indicating the status of the monitoring signal provided by the sensing contacts 16.

Figure 7:
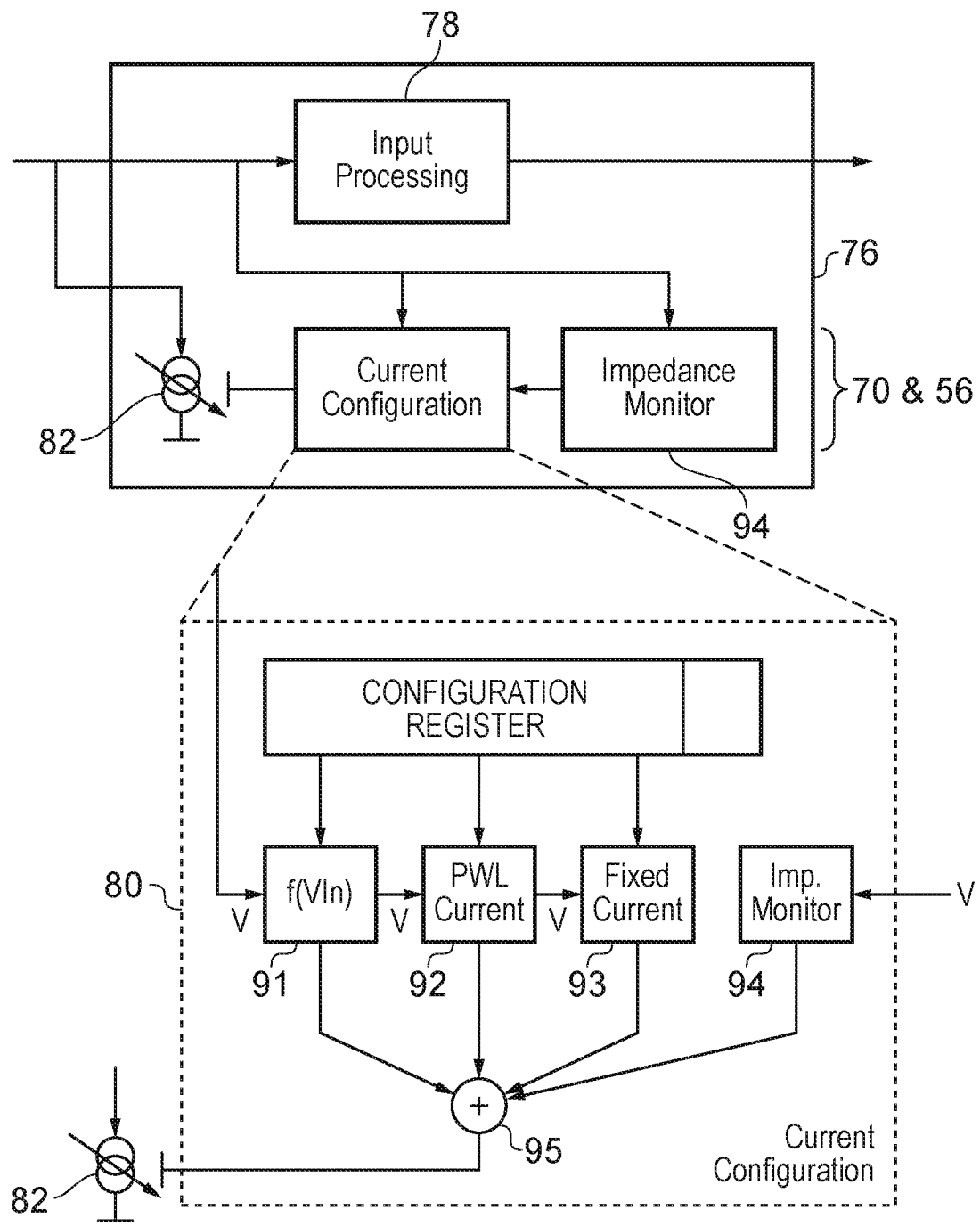
FIG. 7 shows sub-systems within the current configuration system in greater detail.

FIG. 7 shows the current configuration system 80 in greater detail. The current configuration system 80 may comprise several sub-systems. Examples of such sub-systems include a current supply 91 where the current varies as a function of the input voltage. A simple function would be to make the current proportional to the voltage, thereby simulating current flow through a resistor. As a further alternative a capacitor may be used such that the current flow is proportional to the rate of charge of voltage. This gives a wetting current as the input is switched. Both of these approaches may be used singularly or in combination. However other functions can be implemented. The functions may be continuous or they may be discontinuous (stepped).

A second module or sub-system 92 may provide a piece-wise linear current of a controllable magnitude and duration. The second sub-system 92 may be responsive to changes in the input voltage as shown and/or may be responsive to an external trigger.

A third sub-system 93 may supply a fixed current. However that current may be switched on or off in response to the input voltage and/or an external trigger. Alternatively the value of the "fixed" current may be a value which has a first value if the input voltage lies in a first voltage range and a second value if the input voltage lies in a second voltage range (not overlapping with the first) but hysteresis may be applied to the transition between voltages.

An impedance monitor 94 provided, for example, as part of the health check system may also be provided and be able to command a change in the current so as to be able to determine the contact impedance of the sensing contacts.

The various current demands are summed by a summer 95, and a current demand signal used to cause the current source 82 to cause a current to flow at the input node, and hence through the sensing contact.

Figure 8:
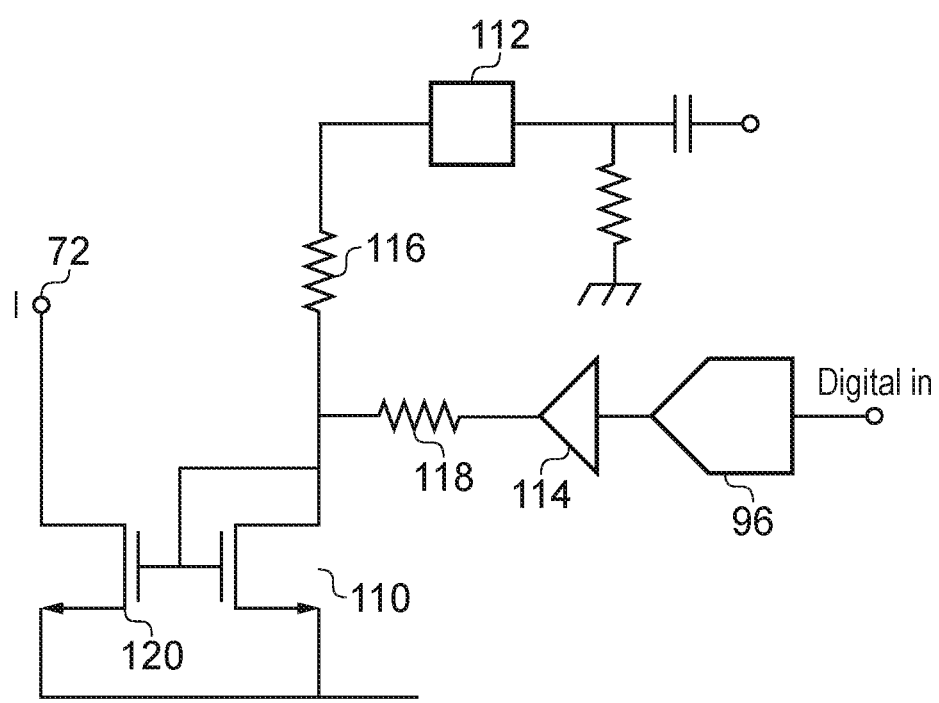
FIG. 8 illustrates a circuit diagram for an embodiment of the variable load.

The current drawn by the adjustable load 70 can be controlled/set by various circuits, including a bank of resistors that can be switched into and out of a current flow path. However an approach with more resolution and control is to control the current with a current mirror circuit in operation with a voltage to current convertor, such as that shown in FIG. 8. Thus, a digital to analog convertor 96 may receive a digital word indicating the amount of current that should be drawn by the programmable and hence adjustable current load. The digital word may be provided either to set a wetting current or it may be used in the determination as to whether an input signal is real or is spurious as described hereinbefore. If the rate of change of voltage is monitored by an analog to digital converter (ADC) operating within the programmable input circuit 50, then a output of the ADC can be processed to provide a signal to the digital to analogue convertor 96 within the adjustable load. However, it would also be possible to monitor the evolution of voltage by way of, for example, a capacitor and resistor high pass filter combination which might be connected directly to the drain of a master transistor 110 within the current mirror or which might trigger a monostable 112 to provide a fixed duration pulse to the drain of the transistor 110. Thus the load 70 could be triggered both from control signals within the digital domain and control signals emanating from within an analog domain. The voltage from the monostable 112 or the analogue to digital convertor 90 (optionally by way of a buffer 114) can be converted into current via series resistors 116 and/or 118. The current then flows through the diode connected transistor 110, which has its gate connected to a slave transistor 120 to form a current mirror, as is well known to the person skilled in the art, to draw a current via the node 72.

As noted before each of the programmable filter 52, event viewer 54, health checking component 56 and programmable load 70 may need to communicate its information with other components within the controller 20. However in the event of device failure the input circuitry, filter 52, event viewer 54 and health check system 56 as well as load 70 might become exposed to high voltages which would damage the rest of the control system. Therefore digital information from these systems is exchanged with the rest of the controller by way of a communications interface, such as a two wire communications interface 130 shown in FIG. 3 and a data isolator 132 which provides galvanic isolation between the communications interface and the input circuit 50, filter 52, event viewer 54 and health checker 56.

Figure 9:
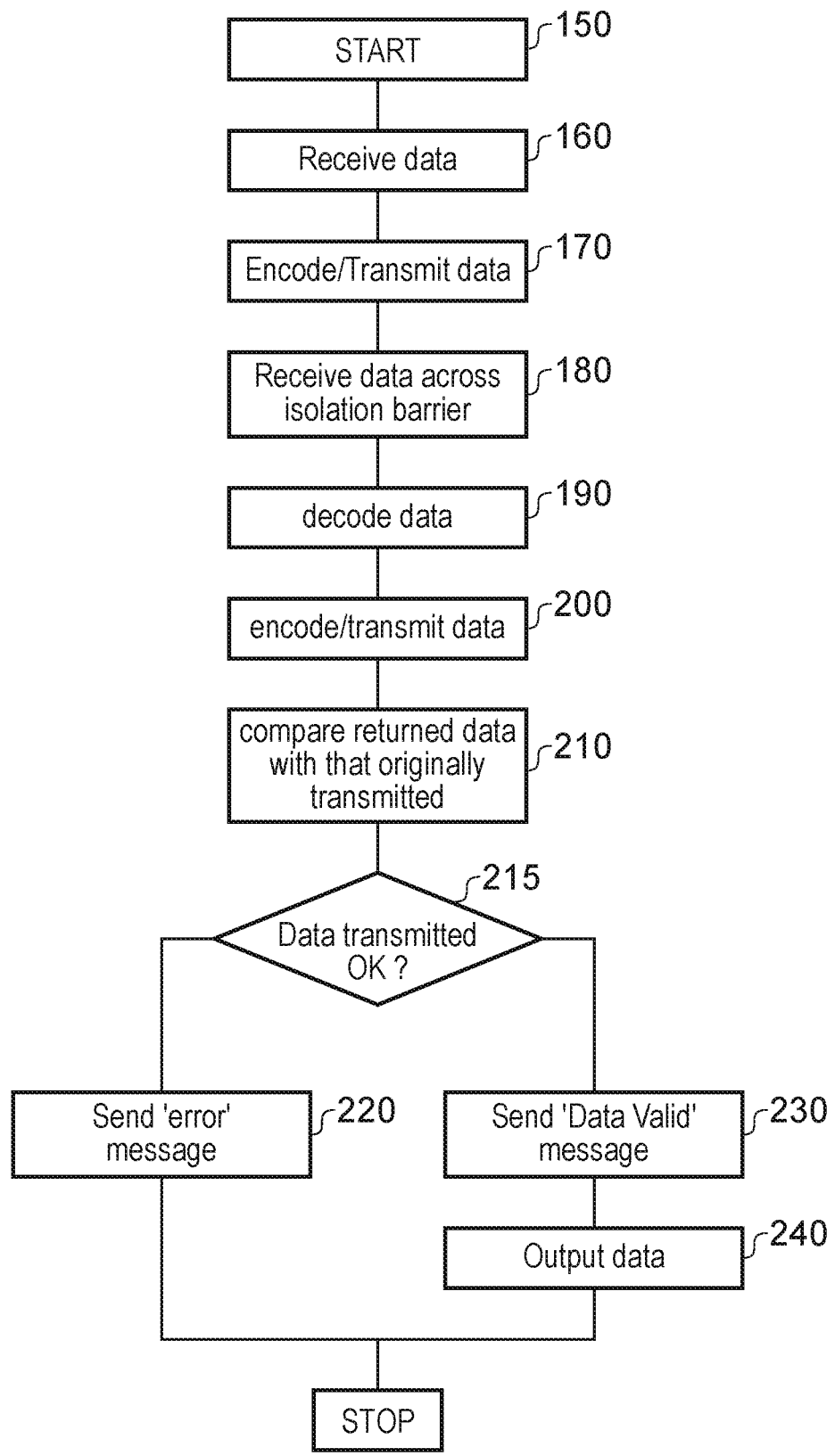
FIG. 9 is a flow chart showing steps performed as part of a data exchange across the isolation barrier in an embodiment of this disclosure.

Digital data could simply be transmitted by way of DC blocking capacitors. However other isolation devices, such as optical isolators and magnetic couplers also exist and which may provide more robust isolation, especially in terms of common mode rejection. Preferably data transmitters and receivers in association with the isolation barrier may be used in a handshaking mode rather than an open loop mode. Such an arrangement will be discussed with respect to FIG. 9. For the purpose of this discussion it will be assumed that the programmable filter 52 has been selected by way of instructions sent over the communication interface 130 and isolator 132 to transmit the status of a selected input node. The node data may be prefaced by an identifier indicating the number of the node and then contain one of more bits of data representing the status of that node.

The isolator may be provided in association with a suitable data conditioning circuit that receives incoming data, for example as a word and formats it in a form suitable for transmission across the isolation barrier. We may assume for simplicity that the word is placed in a word buffer at step 150. From here assume that a parallel to serial conversion is performed by a data transmitter such that each bit of the data is sequentially received at step 160 from the word buffer, encoded at step 170 (for example by pulse encoding the rising and falling edges of a bit in different ways or representing a "1" with a tone of a first frequency and a "0" with a tone of a second frequency or no tone at all), and passing the data across the isolation barrier. A receiver circuit associated with, for example provided as part of, the isolator 132 decodes the received data at step 190 to regenerate the transmitted bit. The received data, either on a bit-by-bit basis or a word-by-word basis can be re-encoded at step 200 and transmitted back across the isolation barrier to the data transmitter. The data transmitter can then compare the word that it received at step 150 with the word returned to it from the receiver at step 210 and 215. The comparison of the word that was originally sent and the word which has been received across the isolation barrier can be performed by storing the received data in a correspondingly sized register and a bit by bit exclusive or (XOR) can be performed in order to check if all of the bits are identical.

If there is a discrepancy, the data can be flagged as being in error at step 220. This may cause the data processor 32 to implement some recovery procedure, for example instructing the data to be resent and/or modifying the procedure it used to control the circuit breaker. Furthermore, the data transmitter may also be arranged to confirm that the data provided by the receiver was indeed correct, and it can send a "data valid" signal at step 230 to the receiver to tell the receiver that the data that it has received is valid, and then can be output at step 240 to other devices over the communication interface 130. It will be appreciated that other data channels may be provided to speed data throughput and/or to provide bidirectional communication across the isolator.

The data link incorporating the isolator may be used to transmit empty data packets or link checking data when no useful data is transmitted so as to monitor the link to avoid any failure thereof going undetected.

It may be desirable to make the monitoring system more robust and enhance its ability to detect fault within the supply network that it is monitoring. For example, multiple sensing contacts may be provided within a relay and/or a single sensing contact may be connected to multiple input nodes via suitable impedances such that redundancy and additional signal processing robustness is provided by the binary input module. When multiple inputs relate to the same armature, then majority voting may be applied to combine the several inputs into a single output. The multiple inputs may come from a single contact or from multiple armature contacts. Although not illustrated in FIG. 3, the binary input module may also include one or more majority vote or other combinational logic circuits which are programmable to allow for simple signal combinations to be tested and acted on. However a disadvantage with this approach is the use of additional inputs requires additional channels and additional pins. Furthermore if the additional inputs provide redundant measurements of the same point in a system, then the reason for a fault being reported may be hidden.

Consider the operation of a single impedance monitor on a single channel that is monitoring the status of a normally closed contact. The impendence monitor can look at the impedance that exists in a path from the impedance monitor through wiring to the contact, and then from the contact through more wiring to a voltage source (such as a battery providing the sensing voltage). If the impedance goes unexpectedly high, indicating a fault, the location of the fault is unknown. One cannot tell the difference between a fault at the voltage source, oxide build up on the contacts or problems with the connecting cables or cable terminals.

However by aggregating data from different points in the system the nature of the failure can be resolved, or at least the number of possible causes reduced. Thus, a pair of inputs could be configured with one connected to a sensing contact and one connected to the voltage source to determine whether the problem is caused by a supply fault or is specific to the sensing contact.

Alternatively, where some circuit components are shared, such as the voltage source, the presence or absence of a shared failure can be used to infer where the failure occurs.

Additionally providing a sensing path that replicates part or all on an input signal path may provide redundancy against failure of that replicated path but only require one pin. This could provide protection against failure of an attenuator within the input module.

The input signal conditioning circuit may provide multiple different paths for at least part of the signal path through the conditioning circuit. For example implementing paths within different levels of attenuation and/or different filtering techniques in conjunction with majority voting gives redundancy (for example if some filters fail to reject a signal others may correctly reject it) and the option to enhance resilience for example by changing the majority needed to pass a vote.

The event monitor may, depending on the size of memory allocated to it, repeatedly record various voltage, current and relay position and performance measurements or a rolling basis such that if a noteworthy event occurs that data can be made available for fault mode analysis.

The provision of controllable gain, filtering and current stages facilitates the integration of the input module into an integrated circuit to replace the plurality of individual printed circuit boards that are commonplace at the time of writing this disclosure.

The binary input module and/or the processor 32 in communication with it may adjust the filter responses. The binary input module 36 may be arranged such that the filter responses vary as a function of the impedance of the contacts as determined by the contact health check (impedance monitor) as, for example, a higher impedance may imply a greater susceptibility to noise. Thus the filter response may be adapted dynamically to provide higher resilience to noise when needed, and provide faster response times when the improved resilience is not needed.

Another approach is to provide multiple filters with different characteristics acting on the same input signal and to weight or mask their outputs as appropriate. Thus outputs may be masked in response to measurement of output impedance. The number of filters operating may be adjusted depending on estimates of noise or interference in the system. Thus all the filters could be masked in the event of an EMC event (such as a lightening strike) based on rate of charge of voltage input and overvoltage conditions. Filters may also be masked or have a lower weight assigned to them if they are judged to be faulty by the processor 32.

It is thus possible to provide an integrated circuit having the necessary functionality to be used in a wide variety of binary input systems, such as those found within the relay and circuit breaker control environment.

Some channels of the binary input may be arranged to monitor the relay/circuit breaker contacts directly instead of or as well as monitoring the sensing contacts, for example by operating in a current mode to monitor the contact impedance.

The claims presented here are in single dependency format suitable for filing at the United States Patent and Trademark Office. However it is to be understood that each claim can be multiply dependent on any proceeding claim except when that it clearly technically unfeasible. Therefore, for the purposes of assessing claimed subject matter combinations, the assumption should be made that each claim is multiply dependent on all proceeding claims.

The invention claimed is:

1. A relay or circuit breaker monitoring system comprising:
a power isolator providing electrical isolation between a galvanically interconnected first domain and a galvanically interconnected second domain, the second domain including a supply voltage node from which an isolated supply voltage in the first domain is generated via the power isolator to be consistently available in the first domain regardless of a state of the relay or circuit breaker in the first domain;
a signal conditioning circuit operating in the first domain, the signal conditioning circuit comprising:
at least one input node connected to an input stage for processing an input signal received at the at least one input node;
a load to apply a load at the at least one input node; and
wherein at least a portion of the signal conditioning circuit is powered by the isolated supply voltage and wherein the signal conditioning circuit is configured to provide a relay or circuit breaker control signal based upon the input signal.

2. The system of claim 1, in which the signal conditioning circuit includes a filtering circuit powered by the consistently available isolated supply voltage, wherein the filtering circuit is configured to de-bounce the input signal.

3. The system of claim 1, comprising a programmable attenuator.

4. The system of claim 1, comprising a programmable threshold circuit and/or comparator.

5. The system of claim 1, wherein the adjustable load is connected to the at least one input node and responds to an increase in the rate of change of the input to increase the current drawn by the load.

6. The system of claim 1, in which the adjustable load passes a current that is controlled by a current source.

7. The system of claim 1 further comprising a programmable filter.

8. The system of claim 1 further comprising an event logger.

9. The system of claim 1 further comprising an at least one isolator, and data processing circuits on either side of the isolation barrier for transmitting data between a first side of the isolation barrier and a second side of the isolation barrier.

10. The system of claim 9 in which the data processing circuits are configured to confirm to each other what data has been transmitted.

11. The system of claim 1 in which the signal conditioning circuit comprises a plurality of signal processing paths connected to at least one input node, and the outputs of the signal processing paths are provided to a majority vote circuit.

12. The system of claim 1 further comprising an integrated circuit scale package.

13. The system of claim 1 further comprising a relay or circuit breaker controller.

14. The system of claim 13 when, in use, the adjustable load is connected to sensing contacts of the relay or circuit breaker to provide a load current and/or a wetting current.

15. The system of claim 1, further comprising:
a data isolator providing electrical isolation between the galvanically interconnected first domain and the galvanically interconnected second domain, the data isolator configured to pass between the first and second domains data from the signal conditioning circuit that is based upon the input signal, wherein the data isolator is monolithically integrated with the power isolator.

16. The system of claim 14, further comprising a monitoring node connected to at least one sensing contact of the relay or circuit breaker for causing the sensing contacts to close in response to a switching event.

17. The system of claim 1, wherein at least a portion of the signal conditioning circuit is powered by the isolated supply voltage and monolithically integrated with the power isolator.

18. The system of claim 1, wherein the load includes an adjustable load.

19. The system of claim 1, wherein the load passes a current that is controlled by a current source.

20. The system of claim 1, further comprising a user-programmable load circuit to apply the load to the input node.

21. A relay controller responsive to at least one input signal in order to change the state of a relay, comprising:
a power isolator providing electrical isolation between a galvanically interconnected first domain and a galvanically interconnected second domain, the second domain including a supply voltage node from which an isolated supply voltage in the first domain is generated via the power isolator to be consistently available in the first domain regardless of a state of the relay or circuit breaker in the first domain;
a data isolator providing electrical isolation between the galvanically interconnected higher voltage first domain and the galvanically interconnected lower voltage second domain, the data isolator configured to pass between the first and second domains data from the signal conditioning circuit that is based upon the input signal;
a programmable signal conditioning circuit; and
a programmable input signal.

22. The relay controller of claim 21, wherein the programmable signal conditioning circuit is galvanically interconnected in the first domain and is powered from the isolated supply voltage.

23. The relay controller of claim 21, wherein the programmable signal conditioning circuit includes a thresholding circuit.

24. The system of claim 21, further comprising a user-programmable load circuit to apply an adjustable load to an input node, wherein the adjustable load is adjustable in response to a rate of change of voltage of the input signal.

25. The system of claim 21, further comprising:
a fixed attenuator; and
a variable gain amplifier connected to an analog-to-digital converter (ADC).

26. The system of claim 21, in which the relay or circuit breaker monitoring system comprises:
a programmable threshold and hysteresis unit that produces an output based upon the input signal; and
a programmable glitch filter, that receives and filters glitches from the output of the programmable threshold and hysteresis unit.

27. The system of claim 21, wherein the data isolator is monolithically integrated with the power isolator.

28. A signal processing circuit for use in a relay or circuit breaker monitoring and/or management system, the signal processing circuit comprising:
a power isolator providing electrical isolation between a galvanically interconnected first domain and a galvanically interconnected second domain, the second domain including a supply voltage node from which an isolated supply voltage in the first domain is generated via the power isolator to be consistently available in the first domain regardless of a state of the relay or circuit breaker in the first domain;

a data isolator providing electrical isolation between the galvanically interconnected first domain and the galvanically interconnected second domain, the data isolator configured to pass between the first and second domains data from the signal conditioning circuit that is based upon the input signal;

a programmable signal conditioning circuit; and a programmable multichannel attenuator operating in the first domain.

29. The system of claim 28, wherein the data isolator is monolithically integrated with the power isolator.

* * * * *